United States Patent
Choi et al.

(10) Patent No.: US 11,632,117 B2
(45) Date of Patent: Apr. 18, 2023

(54) FREQUENCY MODULATION SYSTEM BASED ON PHASE-LOCKED LOOP CAPABLE OF PERFORMING FAST MODULATION INDEPENDENT OF BANDWIDTH AND METHOD OF THE SAME

(71) Applicants: ELECTRONICS AND TELECOMMUNICATIONS RESEARCH INSTITUTE, Daejeon (KR); Korea Advanced Institute Of Science And Technology, Daejeon (KR)

(72) Inventors: Han Gil Choi, Daejeon (KR); Sang Heung Lee, Daejeon (KR); Seong Hwan Cho, Daejeon (KR)

(73) Assignees: Electronics and Telecommunications Research Institute, Daejeon (KR); Korea Advanced Institute of Science and Technology, Daejeon (KR)

( * ) Notice: Subject to any disclaimer, the term of this patent is extended or adjusted under 35 U.S.C. 154(b) by 0 days.

(21) Appl. No.: 17/513,657

(22) Filed: Oct. 28, 2021

(65) Prior Publication Data
US 2022/0131546 A1 Apr. 28, 2022

(30) Foreign Application Priority Data

Oct. 28, 2020 (KR) .......... 10-2020-0141063
Oct. 1, 2021 (KR) .......... 10-2021-0130970

(51) Int. Cl.
*H03L 7/093* (2006.01)
*H03L 7/10* (2006.01)
*H03L 7/089* (2006.01)

(52) U.S. Cl.
CPC ............ *H03L 7/093* (2013.01); *H03L 7/0891* (2013.01); *H03L 7/104* (2013.01)

(58) Field of Classification Search
CPC ....... H03L 7/093; H03L 7/0891; H03L 7/089; H03L 7/085; H03L 7/08; H03L 2207/50; H03L 2207/00; H03L 7/091
See application file for complete search history.

(56) References Cited

U.S. PATENT DOCUMENTS 7,982,552 B2   7/2011  Shin et al.
8,552,775 B2  10/2013  Lee et al.
(Continued)

FOREIGN PATENT DOCUMENTS

KR   101180144 B1   9/2012
KR   102102328 B1   4/2020

*Primary Examiner* — Diana J. Cheng
(74) *Attorney, Agent, or Firm* — Rabin & Berdo, P.C.

(57) ABSTRACT

The present invention relates to a frequency modulation method based on a phase-locked loop capable of performing fast modulation independent of bandwidth.

A frequency modulation system based on a phase-locked loop capable of performing fast modulation independent of bandwidth according to the present invention includes a loop filter including a proportional path and an integral path to determine a bandwidth of a phase-locked loop, a voltage-controlled oscillator configured to adjust a frequency according to an output of the loop filter, and a slope alternator configured to alternate an input current of the loop filter, wherein the slope alternator is located in the integral path of the loop filter to generate an offset current at a moment of change from a modulation rise to a modulation fall.

4 Claims, 14 Drawing Sheets

(56) References Cited

U.S. PATENT DOCUMENTS 10,447,282 B2 * 10/2019 Abcarius .............. H03L 7/0891
10,976,409 B2    4/2021 Lee et al.

* cited by examiner

SIGNAL

FREQUENCY MODULATION SYSTEM BASED ON PHASE-LOCKED LOOP CAPABLE OF PERFORMING FAST MODULATION INDEPENDENT OF BANDWIDTH AND METHOD OF THE SAME

CROSS-REFERENCE TO RELATED APPLICATION

This application claims priority to and the benefit of Korean Patent Application Nos. 10-2020-0141063, filed on Oct. 28, 2020, and 10-2021-0130970, filed on Oct. 1, 2021, the disclosure of which is incorporated herein by reference in its entirety.

BACKGROUND

1. Field of the Invention

The present invention relates to a frequency modulation method based on a phase-locked loop capable of performing fast modulation independent of bandwidth.

2. Discussion of Related Art

A phase-locked loop is a frequency negative feedback circuit configured to always constantly maintain a frequency of an output signal.

According to the related art, a modulation signal is limited to a bandwidth of the phase-locked loop, and when fast modulation is implemented, there is a problem in that the modulation signal is distorted.

(Patent Document 1) Korean Registration Patent No. 10-1180144

SUMMARY OF THE INVENTION

The present invention is directed to providing a frequency modulation system capable of securing a fast modulation ability independent of bandwidth, suitable for a compound-based process and a high-frequency operation, capable of being simply implemented, and improving area efficiency, and a frequency modulation method.

According to an aspect of the present invention, there is provided a frequency modulation method based on a phase-locked loop capable of performing fast modulation independent of bandwidth, including: (a) determining a moment of change from a modulation rise to a modulation fall; and (b) generating an offset current at the moment of change from the modulation rise to the modulation fall, and summing the offset current and a charge pump current to alternate an input current of a loop filter.

In the operation (b), the offset current may be generated using a slope alternator circuit located in an integral path of the loop filter.

In the operation (b), the offset current having a magnitude twice a magnitude of the charge pump current and having a direction opposite a direction of the charge pump current may be generated.

In the operation (b), the offset current may not be output during the modulation rise.

According to another aspect of the present invention, there is provided a frequency modulation system based on a phase-locked loop capable of performing fast modulation independent of bandwidth, including: a loop filter including a proportional path and an integral path to determine a bandwidth of a phase-locked loop; a voltage-controlled oscillator configured to adjust a frequency according to an output of the loop filter; and a slope alternator configured to alternate an input current of the loop filter, wherein the slope alternator is located in the integral path of the loop filter to generate an offset current at a moment of change from a modulation rise to a modulation fall.

The slope alternator may generate the offset current having a magnitude twice a magnitude of a charge pump current in the proportional path and having a direction opposite a direction of the charge pump current.

The slope alternator may sum the charge pump current and the offset current to alternate the input current of the loop filter.

According to the present invention, there is an effect in that a new type of a frequency modulation method based on a phase-locked loop (a modulator) is proposed, and thus a frequency modulation system secures a fast modulation ability independent of bandwidth, becomes suitable for a compound-based process and a high-frequency operation, is simply implemented, and improves area efficiency.

Effects of the present invention are not limited to the above-mentioned effects, and other effects which are not mentioned may be apparently understood by those skilled in the art from below.

BRIEF DESCRIPTION OF THE DRAWINGS

The above and other objects, features and advantages of the present invention will become more apparent to those of ordinary skill in the art by describing exemplary embodiments thereof in detail with reference to the accompanying drawings, in which.

DETAILED DESCRIPTION OF EXEMPLARY EMBODIMENTS

The above-described purposes of the present invention, other purposes, advantages and features of the present invention, and a method of achieving them will be apparent with reference to embodiments which are described below in detail in conjunction with the accompanying drawings.

However, the present invention is not limited to the embodiments which will be described below and may be embodied in different forms. The embodiments are only provided to easily convey the purposes, components, and effects of the present invention to those skilled in the art, and the present invention is defined by the disclosed claims.

Meanwhile, terms used in the description are provided not to limit the present invention but to describe the embodiments. In the embodiments, the singular form is intended to also include the plural form unless the context clearly indicates otherwise. The terms 'comprise' and/or 'comprising' as used herein do not preclude the presence or addition of at least one other component, step, operation, and/or element other than the stated components, steps, operations and/or elements.

Hereinafter, in order to help those skilled in the art to understand the present invention, a background in which the present invention is proposed will be described first, and embodiments of the present invention will be described.

Frequency modulation is a modulation method of changing a frequency of a carrier according to an amplitude of a signal wave.

Since noise is easily removed and sound quality is excellent in a frequency modulation method, the frequency modulation method is used for frequency modulation (FM) stereo broadcasting and TV audio.

Since stereo broadcasting may be performed by one radio wave, FM broadcasting becomes the mainstream instead of a current medium-wave AM broadcasting, which has problems such as interference, noise disturbance, an allocated frequency, and the like.

Figure 1A:
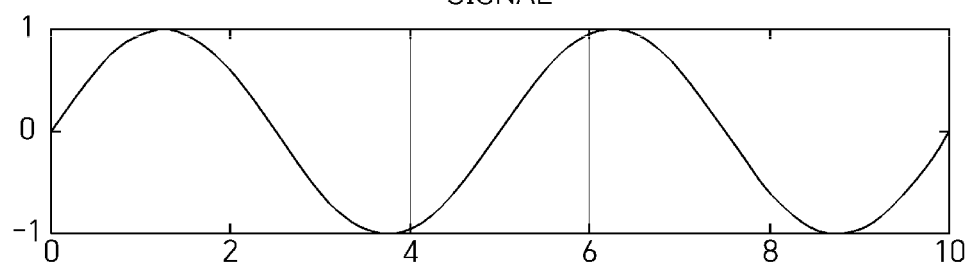
FIG. 1A and FIG. 1B illustrate a frequency modulation method according to the related art.
Figure 1B:
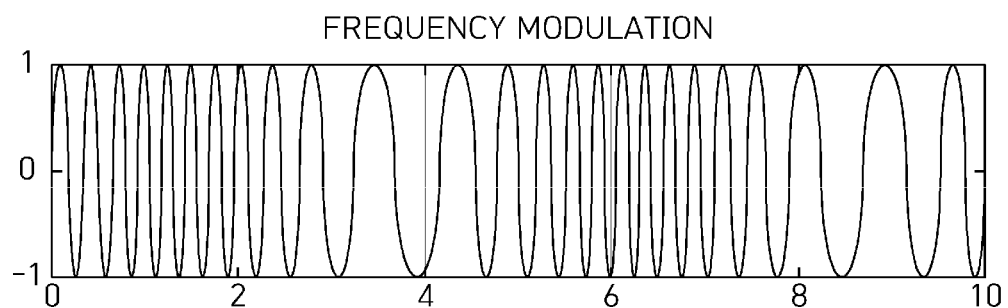

FIG. 1A and FIG. 1B illustrate a frequency modulation method according to the related art.

A frequency modulator is a device which modulates an instantaneous frequency according to a signal.

The frequency modulator is used in devices which require a modulation frequency, such as a broadcasting device, a fax, a telecommunication device, a radar, and the like.

As a characteristic of frequency modulation, a signal-to-noise ratio is excellent and a magnitude of the signal is constant compared to an amplitude modulation method.

A configuration of the frequency modulator is a form in which a block is added based on a phase synchronization loop.

As the operating principle of the frequency modulator, as shown in FIG. 1, an analog signal or a digital signal is received and a signal of a corresponding frequency is output.

Figure 2:
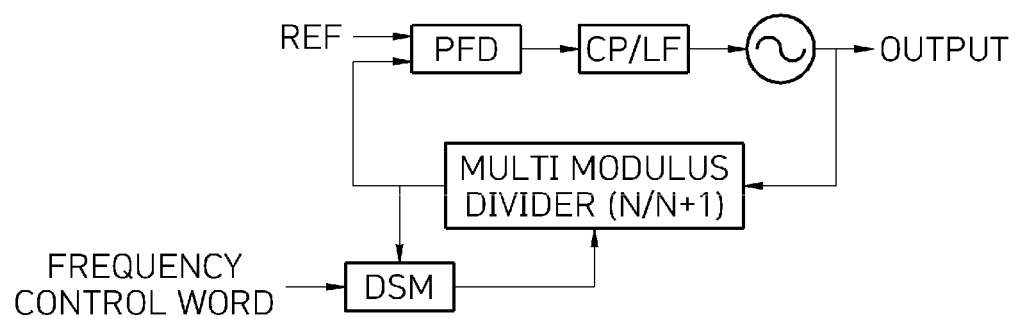
FIG. 2 is a block diagram of a one-point modulation method according to the related art.

FIG. 2 is a block diagram of a one-point modulation method according to the related art.

Referring to FIG. 2, the frequency is modulated through a multi-modulus divider (MMD), which is a block configuring the phase-locked loop.

An output frequency $F_{out}$ is determined by multiplying a frequency Fref of a reference signal by a division value N of a frequency divider, and N is adjusted according to the time to output a desired $F_{out}$ value.

Figure 3:
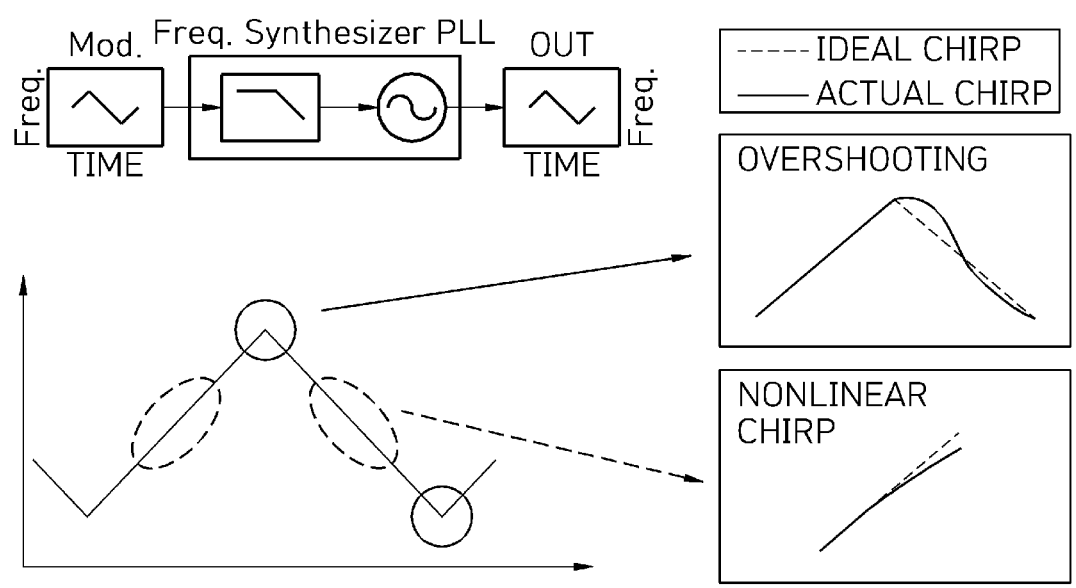
FIG. 3 illustrates a modulation error due to a limited bandwidth according to the related art.

FIG. 3 illustrates a modulation error due to a limited bandwidth according to the related art.

The one-point modulation method according to the related art has a problem in that the modulation signal is limited to the bandwidth of the phase-locked loop, and the modulation signal is distorted when fast modulation is implemented.

Figure 4:
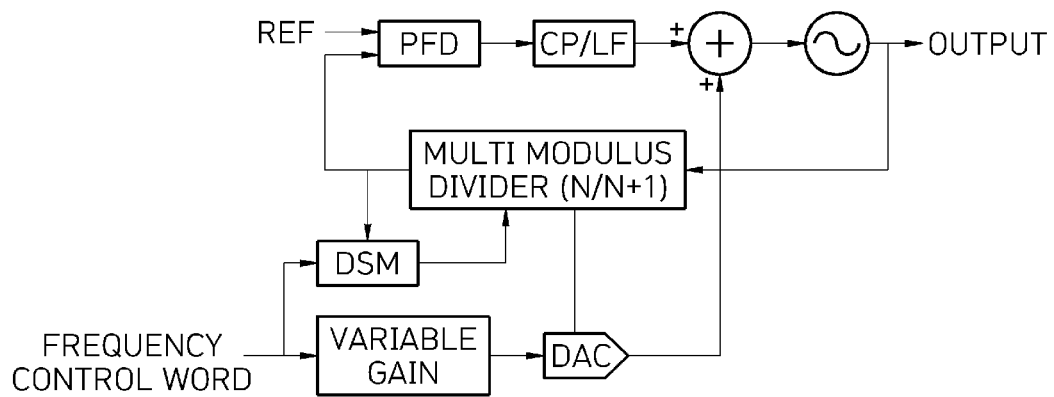
FIG. 4 is a block diagram of a two-point modulation method according to the related art.

FIG. 4 illustrates a block diagram of a two-point modulation method according to the related art.

FIG. 4 is a block diagram of the two-point modulation method.

The two-point modulation method is a method of adding a modulation signal to an input of a voltage-controlled oscillator (VCO) based on the one-point modulation method.

A digital-to-analog converter (DAC) converts a digital modulation signal to an analog form, and transfers the signal to the VCO input through a voltage-based adder.

The corresponding signal has a high-pass characteristic corresponding to the bandwidth of the phase-locked loop.

Since the high-pass characteristic is added to a low-pass characteristic of the one-point modulation, the entire modulation signal has an all-pass characteristic, and since the bandwidth of the phase-locked loop does not limit a modulation rate, high-speed modulation may be performed.

The two-point modulation method according to the related art has a problem in that a transmission characteristic of the modulation signal is distorted due to the nonlinearity of the VCO.

Further, a complicated calibration block is required to correct the distortion of the transmission characteristic of the modulation signal, and the block requires a memory (for example, a static random access memory (SRAM)), and thus an implementation area increases.

In addition, although the limited resolution and linearity of the DAC cause modulation errors, and an analog-friendly compound process (for example, SiGe) is more advantageous than a silicon process for realizing a high-speed frequency synthesizer for synthesizing a frequency over tens of GHz, there is a problem in that the two-point modulation method requires a high-performance digital block (DAC or calibration block) which is difficult to implement in the compound process.

Figure 5:
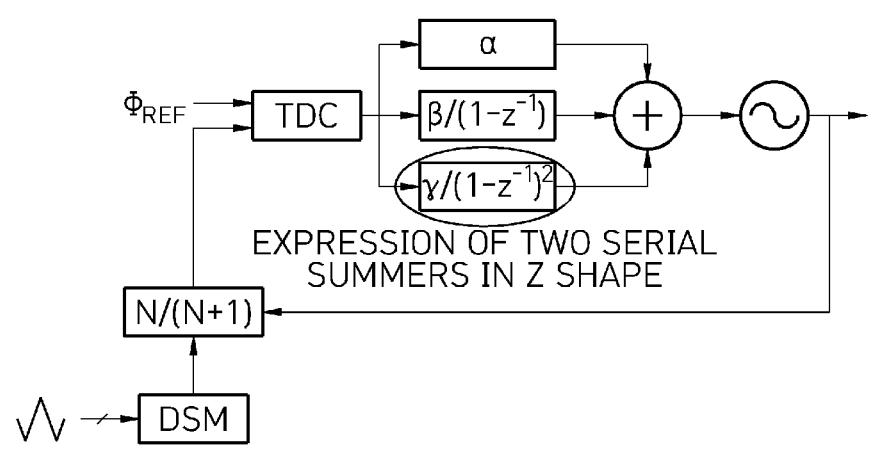
FIG. 5 is a block diagram of a type-III digital phase-locked loop method according to the related art.

FIG. 5 is a block diagram of a type-III digital phase-locked loop method according to the related art.

The type-III digital phase-locked loop is implemented by configuring the phase-locked loop with a digital block and applying two serial summers to a digital loop filter.

Fast modulation independent of bandwidth may be implemented by appropriately controlling operations of the summers.

In the digital phase-locked loop method according to the related art, most of the phase-locked loop including the loop filter should be composed of digital blocks, and there is a problem in that the digital phase-locked loop method is inappropriate for a compound process and requires a complicated design.

To solve the above problems, the present invention is directed to providing a frequency modulation system capable of securing a fast modulation ability independent of bandwidth, suitable for a compound-based process and a high-frequency operation, capable of being simply implemented and improving area efficiency, and a frequency modulation method.

Figure 6:
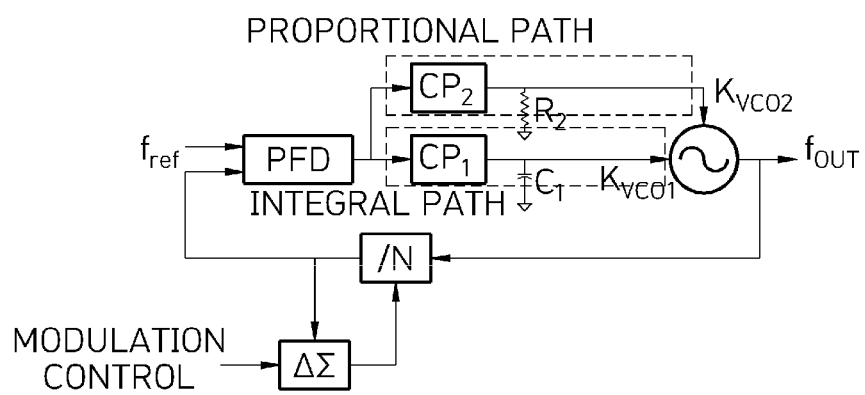
FIG. 6 is a block diagram of a dual-loop phase-locked loop according to an embodiment of the present invention.
Figure 7A:
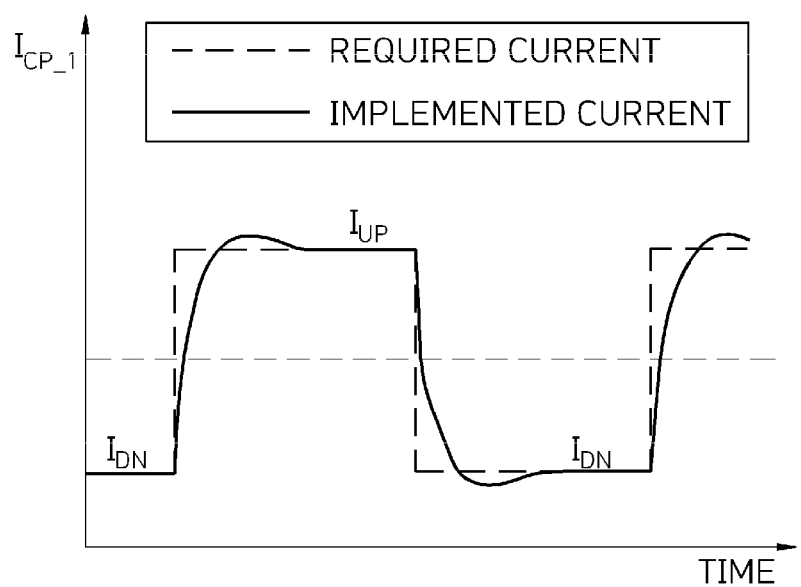
FIG. 7A and FIG. 7B illustrate a charge pump current ($I_{CP}$) and a phase-locked loop (PLL) output frequency ($f_{out}$) during modulation.
Figure 7B:
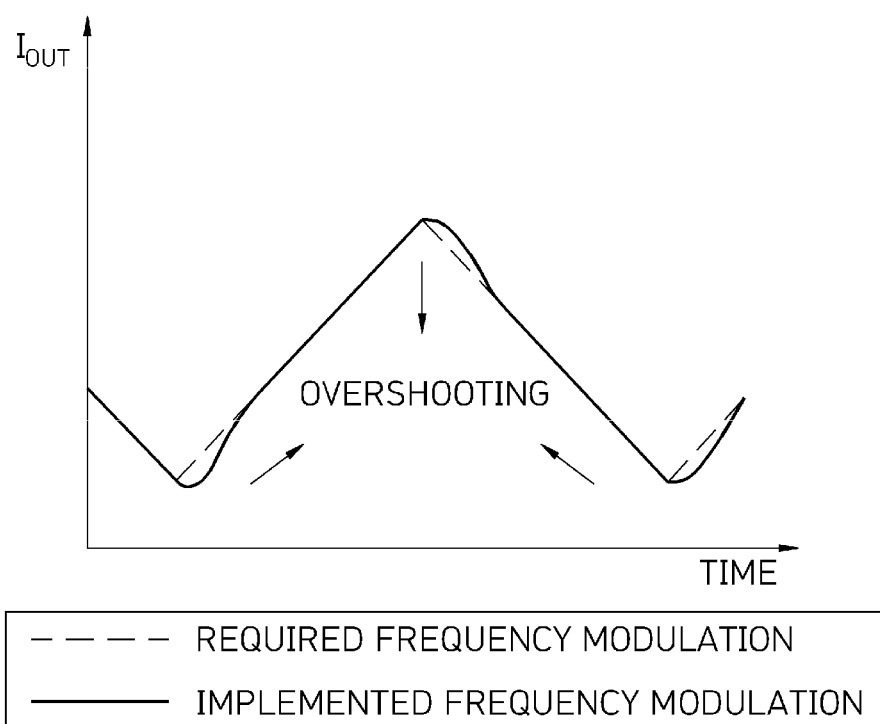

FIG. 6 is a block diagram of a dual-loop phase-locked loop according to an embodiment of the present invention, and FIG. 7A and FIG. 7B illustrate a charge pump current ($I_{CP}$) and a phase-locked loop (PLL) output frequency ($f_{out}$) during modulation.

During the frequency modulation, an input current ($I_{CP}$) of a capacitor (C1) in the integral path determines a frequency modulation slope.

When the modulation changes from rise to fall or from fall to rise, the $I_{CP}$ should also change.

In this case, only a direction of the $I_{CP}$ changes while the $I_{CP}$ maintains a magnitude thereof.

A time inversely proportional to the bandwidth is required to realize a desired $I_{CP}$, and frequency modulation errors occur during this process.

Figure 8:
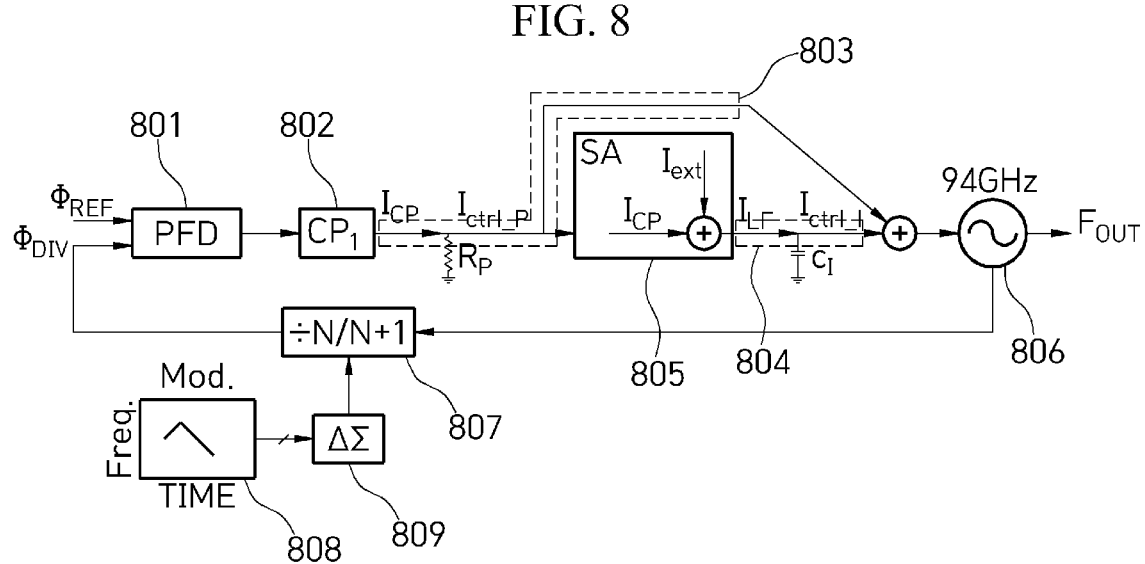
FIG. 8 illustrates a frequency modulation system based on a phase-locked loop capable of performing fast modulation independent of bandwidth according to the embodiment of the present invention.

FIG. 8 illustrates a frequency modulation system based on a phase-locked loop capable of performing fast modulation independent of bandwidth according to the embodiment of the present invention.

The frequency modulation system based on a phase-locked loop capable of performing fast modulation independent of bandwidth according to the embodiment of the present invention includes a phase-frequency detector (PFD) 801, a charge pump (CP) 802, a loop filter including a proportional path 803 and an integral path 804, a slope alternator 805, a voltage-controlled oscillator (VCO) 806, a multi-modulus divider (MMD) 807, a modulation signal generator 808, and a delta-sigma modulator (DSM) 809.

According to the embodiment of the present invention, the frequency modulation errors are removed using a case in which the $I_{CP}$ required for the modulation rise and the $I_{CP}$ required for the modulation fall have the same magnitude but have opposite directions, and according to the embodiment of the present invention, a charge pump located in the integral path is replaced with a slope alternation (SA) block (slope alternator) 805, which is a proposed structure.

The phase-locked loop according to the embodiment of the present invention generates a frequency through phase comparison with the reference signal.

The phase-frequency detector 801 receives two signals as inputs and outputs a phase difference of the two signals.

The loop filter determines the bandwidth of the phase-locked loop under a given condition.

The voltage-controlled oscillator 806 outputs a signal having a frequency corresponding thereto according to an input voltage.

The multi-modulus divider 807 divides the frequency of the input signal and outputs a corresponding signal.

The modulation signal generator 808 generates frequency modulation information.

The delta-sigma modulator 809 receives a non-integer input, and expresses and outputs the non-integer input as a combination of integers.

The slope alternator 805 determines an amount of an output current based on the input voltage, and serves to alternate the current when the frequency decreases.

According to the embodiment of the present invention, a phase value expressed in time is converted to the voltage value, and in this case, a voltage of the proportional path 803 is used.

The frequency modulation system based on a phase-locked loop capable of performing fast modulation independent of bandwidth according to the present invention includes the loop filter including the proportional path 803 and the integral path 804 to determine the bandwidth of the phase-locked loop, the voltage-controlled oscillator which adjusts the frequency according to the output of the loop filter, and the slope alternator 805 which alternates the input current of the loop filter, and the slope alternator 805 is located in the integral path 804 of the loop filter to generate an offset current at the moment of change from the modulation rise to the modulation fall.

The slope alternator 805 generates an offset current $I_{ext}$ in addition to its role as a conventional charge pump.

Figure 9:
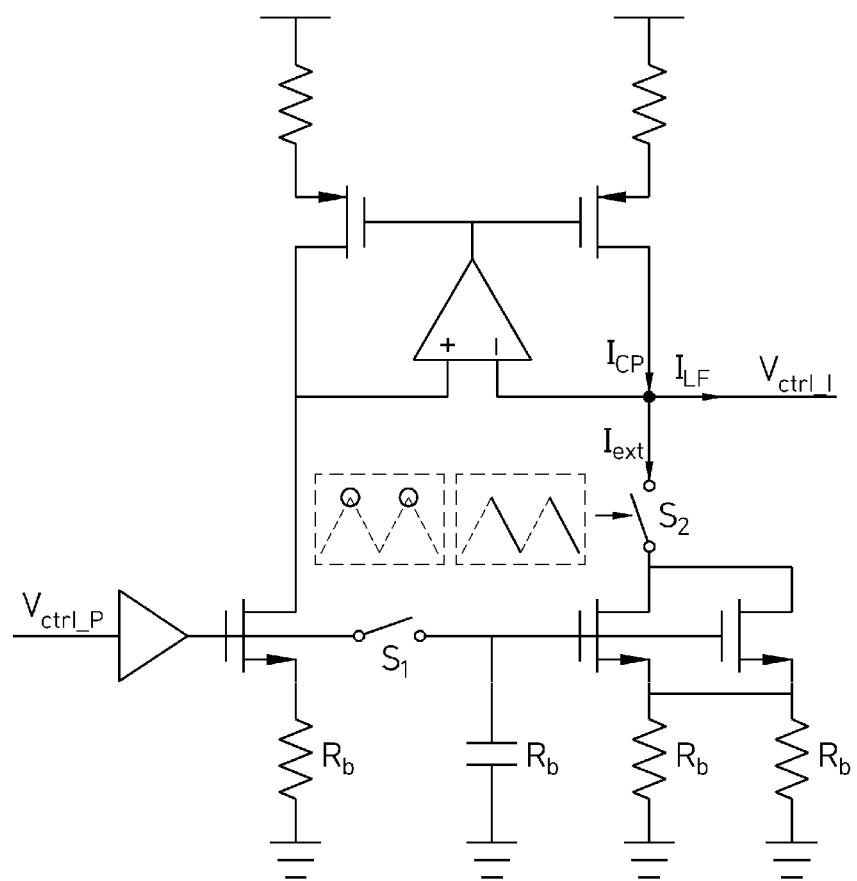
FIG. 9 illustrates a configuration of a slope alternator circuit according to the embodiment of the present invention.

The slope alternator 805 may be implemented in various ways, and for example, may be implemented as shown in FIG. 9.

The slope alternator 805 is designed to have a transfer characteristic of the conventional charge pump.

The slope alternator 805 may generate the offset current having a magnitude twice the magnitude of the charge pump current ($I_{CP}$) in the proportional path and having a direction opposite a direction of the charge pump current The slope alternator 805 may sum the charge pump current and the offset current to alternate an input current (ILF=$I_{CP}$+$I_{ext}$) of the loop filter.

Figure 10:
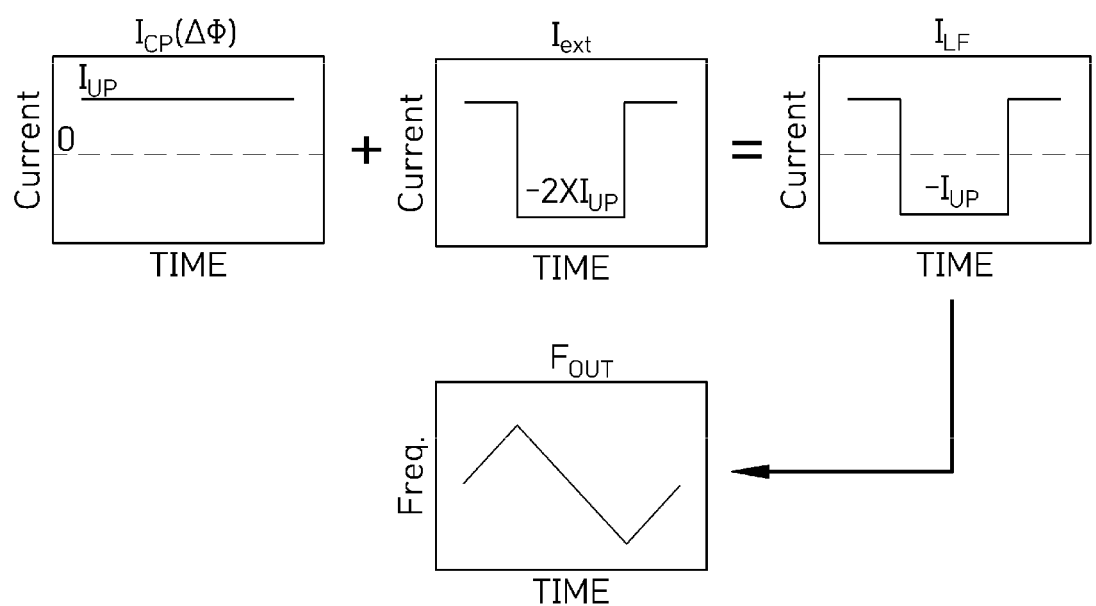
FIG. 10 illustrates graphs of a current and a frequency during a modulation operation according to the embodiment of the present invention.

According to the embodiment of the present invention, there is an effect in that a desired current value and an output frequency are immediately implemented, and FIG. 10 illustrates graphs of a current and a frequency during a modulation operation according to the embodiment of the present invention.

According to the embodiment of the present invention, the modulation may be accurately implemented even at the moment of change of a modulation direction, and the modulation independent of bandwidth may be performed.

Figure 11A:
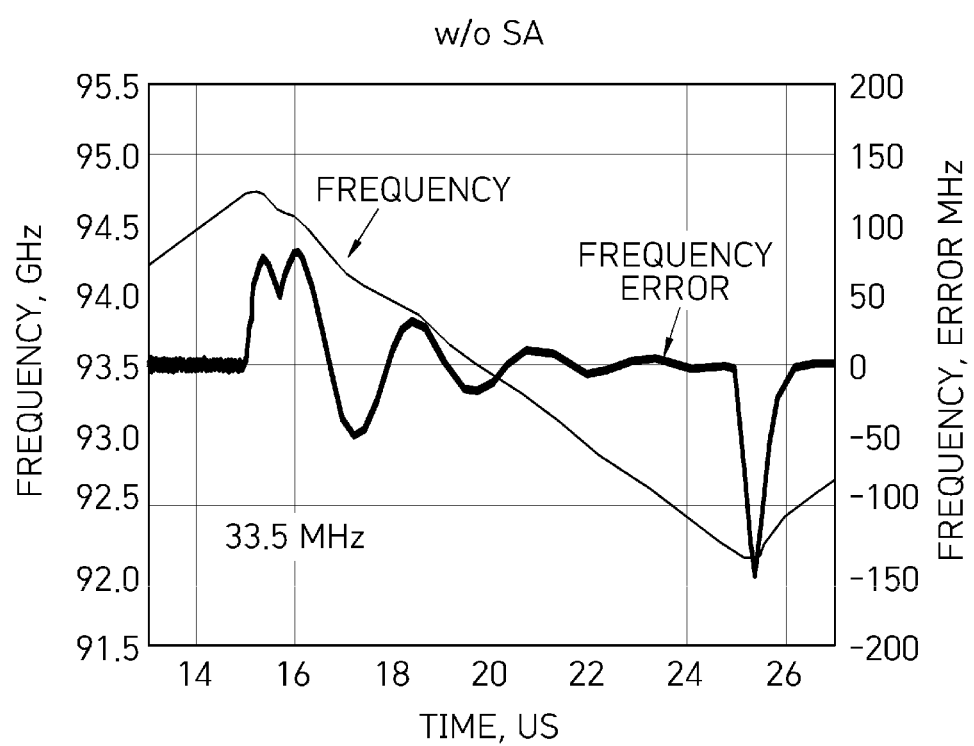
FIG. 11A and FIG. 11B illustrate modulation and frequency error results of a phase-locked loop according to the related art and modulation and frequency error results of the phase-locked loop according to the embodiment of the present invention.
Figure 11B:
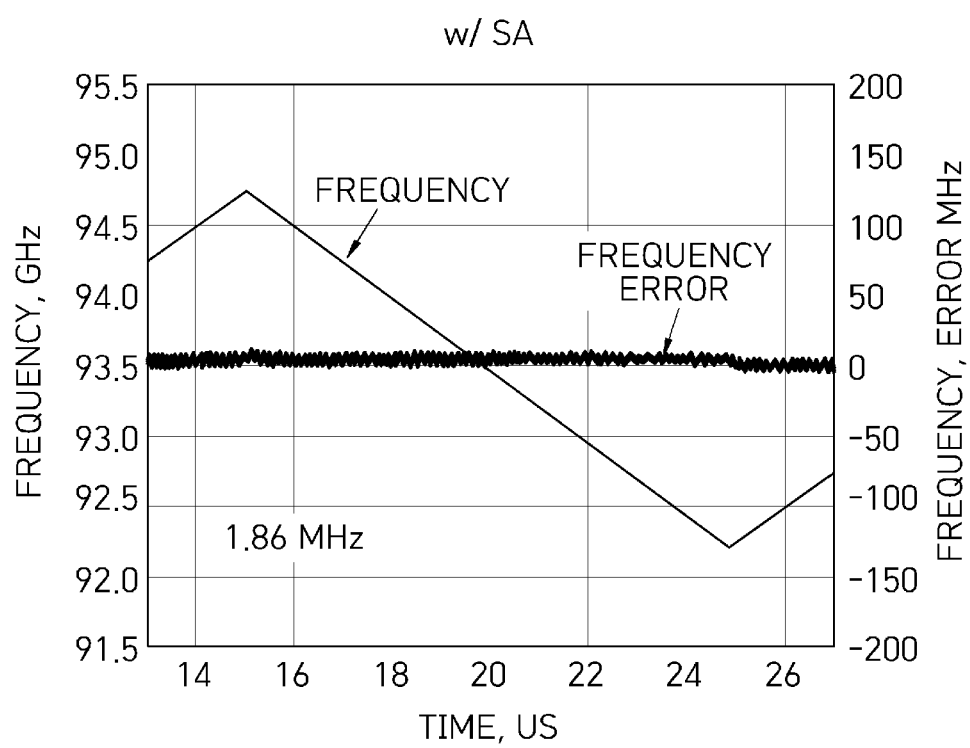

FIG. 11A illustrates modulation and frequency error results of the phase-locked loop according to the related art, and FIG. 11B illustrates modulation and frequency error results of the phase-locked loop according to the embodiment of the present invention.

According to the embodiment of the present invention, it can be seen that desired modulation is properly performed at a point of the change of the modulation direction, and it was confirmed that the modulation error is improved to a 1/18 level under a simulation condition.

The frequency modulation method based on a phase-locked loop capable of performing the fast modulation independent of bandwidth according to the present invention includes (a) determining a moment of change from a modulation rise to a modulation fall, and (b) generating an offset current at the moment of change from the modulation rise to the modulation fall, and summing the offset current and a charge pump current to alternate an input current of a loop filter.

In the operation (b), a slope alternator circuit located in an integral path of the loop filter is used to generate the offset current.

In the operation (b), the offset current having a magnitude twice the magnitude of the charge pump current and having a direction opposite the direction of the charge pump current is generated.

In the operation (b), the offset current is not output during the modulation rise.

According to the embodiment of the present invention, since the input current of the loop filter has frequency modulation slope information, there is an effect in that the fast frequency modulation can be performed independent of bandwidth.

According to the embodiment of the present invention, suitability for compound-based processes and high-frequency operation may be secured.

According to the embodiment of the present invention, since a digital circuit is not required, there is an advantage in that it can be implemented in the compound process suitable for designing a high-speed frequency synthesizer.

According to the embodiment of the present invention, implementation simplicity and area efficiency are improved. Since a digital circuit or a memory is not required, complexity and an area of the modulator may be reduced, and thus implementation is simple, area efficiency may be improved, and there is an effect in that the structure of an analog phase-locked loop is hardly changed, and thus it can be immediately applied to the conventional phase-locked loop.

The components described in the example embodiments may be implemented by hardware components including, for example, at least one digital signal processor (DSP), a processor, a controller, an application-specific integrated circuit (ASIC), a programmable logic element, such as an FPGA, other electronic devices, or combinations thereof. At least some of the functions or the processes described in the example embodiments may be implemented by software, and the software may be recorded on a recording medium. The components, the functions, and the processes described in the example embodiments may be implemented by a combination of hardware and software.

The method according to example embodiments may be embodied as a program that is executable by a computer, and may be implemented as various recording media such as a magnetic storage medium, an optical reading medium, and a digital storage medium.

Various techniques described herein may be implemented as digital electronic circuitry, or as computer hardware, firmware, software, or combinations thereof. The techniques may be implemented as a computer program product, i.e., a computer program tangibly embodied in an information carrier, e.g., in a machine-readable storage device (for example, a computer-readable medium) or in a propagated signal for processing by, or to control an operation of a data processing apparatus, e.g., a programmable processor, a computer, or multiple computers. A computer program(s) may be written in any form of a programming language, including compiled or interpreted languages and may be deployed in any form including a stand-alone program or a module, a component, a subroutine, or other units suitable for use in a computing environment. A computer program may be deployed to be executed on one computer or on multiple computers at one site or distributed across multiple sites and interconnected by a communication network.

Processors suitable for execution of a computer program include, by way of example, both general and special purpose microprocessors, and any one or more processors of any kind of digital computer. Generally, a processor will receive instructions and data from a read-only memory or a random access memory or both. Elements of a computer may include at least one processor to execute instructions and one or more memory devices to store instructions and data. Generally, a computer will also include or be coupled to receive data from, transfer data to, or perform both on one or more mass storage devices to store data, e.g., magnetic, magneto-optical disks, or optical disks. Examples of information carriers suitable for embodying computer program instructions and data include semiconductor memory devices, for example, magnetic media such as a hard disk, a floppy disk, and a magnetic tape, optical media such as a compact disk read only memory (CD-ROM), a digital video disk (DVD), etc. and magneto-optical media such as a floptical disk, and a read only memory (ROM), a random access memory (RAM), a flash memory, an erasable programmable ROM (EPROM), and an electrically erasable programmable ROM (EEPROM) and any other known computer readable medium. A processor and a memory may be supplemented by, or integrated into, a special purpose logic circuit.

The processor may run an operating system (OS) and one or more software applications that run on the OS. The processor device also may access, store, manipulate, process, and create data in response to execution of the software. For purpose of simplicity, the description of a processor device is used as singular; however, one skilled in the art will be appreciated that a processor device may include multiple processing elements and/or multiple types of processing elements. For example, a processor device may include multiple processors or a processor and a controller. In addition, different processing configurations are possible, such as parallel processors.

Also, non-transitory computer-readable media may be any available media that may be accessed by a computer, and may include both computer storage media and transmission media.

The present specification includes details of a number of specific implements, but it should be understood that the details do not limit any invention or what is claimable in the specification but rather describe features of the specific example embodiment. Features described in the specification in the context of individual example embodiments may be implemented as a combination in a single example embodiment. In contrast, various features described in the specification in the context of a single example embodiment may be implemented in multiple example embodiments individually or in an appropriate sub-combination. Furthermore, the features may operate in a specific combination and may be initially described as claimed in the combination, but one or more features may be excluded from the claimed combination in some cases, and the claimed combination may be changed into a sub-combination or a modification of a sub-combination.

Similarly, even though operations are described in a specific order on the drawings, it should not be understood as the operations needing to be performed in the specific order or in sequence to obtain desired results or as all the operations needing to be performed. In a specific case, multitasking and parallel processing may be advantageous. In addition, it should not be understood as requiring a separation of various apparatus components in the above described example embodiments in all example embodiments, and it should be understood that the above-described program components and apparatuses may be incorporated into a single software product or may be packaged in multiple software products.

It should be understood that the example embodiments disclosed herein are merely illustrative and are not intended to limit the scope of the invention. It will be apparent to one of ordinary skill in the art that various modifications of the example embodiments may be made without departing from the spirit and scope of the claims and their equivalents.

What is claimed is:

1. A frequency modulation method based on a phase-locked loop capable of performing fast modulation independent of bandwidth, the method comprising:
   (a) determining a moment of change from a modulation rise to a modulation fall; and
   (b) generating an offset current at the moment of change from the modulation rise to the modulation fall, and summing the offset current and a charge pump current to alternate an input current of a loop filter;
   wherein, in the operation (b), the offset current having a magnitude twice a magnitude of the charge pump current and having a direction opposite a direction of the charge pump current is generated.

2. The method of claim 1, wherein, in the operation (b), the offset current is generated using a slope alternator circuit located in an integral path of the loop filter.

3. The method of claim 1, wherein, in the operation (b), the offset current is not output during the modulation rise.

4. A frequency modulation system based on a phase-locked loop capable of performing fast modulation independent of bandwidth, the system comprising:

a loop filter including a proportional path and an integral path to determine a bandwidth of a phase-locked loop;
a voltage-controlled oscillator configured to adjust a frequency according to an output of the loop filter; and
a slope alternator configured to alternate an input current of the loop filter,
wherein the slope alternator is located in the integral path of the loop filter to generate an offset current at a moment of change from a modulation rise to a modulation fall;
wherein the slope alternator sums the charge pump current and the offset current to alternate the input current of the loop filter; and
wherein the slope alternator generates the offset current having a magnitude twice a magnitude of a charge pump current in the proportional path and having a direction opposite a direction of the charge pump current.

* * * * *